United States Patent
Simin et al.

(10) Patent No.: US 7,655,962 B2
(45) Date of Patent: Feb. 2, 2010

(54) ENHANCEMENT MODE INSULATED GATE HETEROSTRUCTURE FIELD-EFFECT TRANSISTOR WITH ELECTRICALLY ISOLATED RF-ENHANCED SOURCE CONTACT

(75) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 164 days.

(21) Appl. No.: 11/781,338

(22) Filed: Jul. 23, 2007

(65) Prior Publication Data

US 2008/0203430 A1    Aug. 28, 2008

Related U.S. Application Data

(60) Provisional application No. 60/927,983, filed on May 7, 2007.

(51) Int. Cl.
*H01L 29/778* (2006.01)
(52) U.S. Cl. ............................... 257/192; 257/E29.249
(58) Field of Classification Search ................. 257/192
See application file for complete search history.

(56) References Cited

U.S. PATENT DOCUMENTS

| | | | |
|---|---|---|---|
| 5,126,284 A | 6/1992 | Curran | |
| 5,196,907 A | 3/1993 | Birkle et al. | |
| 5,241,193 A | 8/1993 | Pfiester et al. | |
| 6,207,584 B1 | 3/2001 | Shen et al. | |
| 6,285,042 B1 | 9/2001 | Ohtani et al. | |
| 6,589,822 B1 | 7/2003 | Yamazaki et al. | |
| 6,690,042 B2 | 2/2004 | Khan et al. | |
| 6,878,593 B2 | 4/2005 | Khan et al. | |
| 6,903,385 B2 * | 6/2005 | Gaska et al. | 257/192 |
| 2001/0009785 A1 * | 7/2001 | Arafa et al. | 438/210 |
| 2004/0036086 A1 * | 2/2004 | Khan et al. | 257/200 |
| 2004/0061129 A1 * | 4/2004 | Saxler et al. | 257/192 |
| 2005/0173728 A1 * | 8/2005 | Saxler | 257/192 |
| 2005/0274977 A1 | 12/2005 | Saito et al. | |

(Continued)

OTHER PUBLICATIONS

U.S. Appl. No. 11/781,308; "Office Action" Apr. 6, 2009, 9 pages.

(Continued)

*Primary Examiner*—Marcos D. Pizarro
*Assistant Examiner*—Raj Gupta
(74) *Attorney, Agent, or Firm*—John W. LaBatt; Hoffman Warnick LLC

(57) ABSTRACT

Aspects of the present invention provide an enhancement mode (E-mode) insulated gate (IG) double heterostructure field-effect transistor (DHFET) having low power consumption at zero gate bias, low gate currents, and/or high reliability. An E-mode HFET in accordance with an embodiment of the invention includes: top and bottom barrier layers; and a channel layer sandwiched between the bottom and the top barrier layers, wherein the bottom and top barrier layers have a larger bandgap than the channel layer, and wherein polarization charges of the bottom barrier layer deplete the channel layer and polarization charges of the top barrier layer induce carriers in the channel layer; and wherein a total polarization charge in the bottom barrier layer is larger than a total polarization charge in the top barrier layer such that the channel layer is substantially depleted at zero gate bias.

27 Claims, 3 Drawing Sheets

U.S. PATENT DOCUMENTS

2007/0295993 A1 12/2007 Chen et al.
2009/0008804 A1 1/2009 Standing et al.

OTHER PUBLICATIONS

U.S. Appl. No. 11/781,308; "Amendment to Office Action", Jul. 8, 2009, 14 pages.

U.S. Appl. No. 11/781,302; "Office Action", May 1, 2009, 12 pages.

U.S. Appl. No. 11/781,302; "Amendment to Office Action", Jul. 30, 2009, 13 pages.

PCT Application No. PCT/US2008/054368; International Search Report and Written Opinion; Jul. 30, 2008; 10 pages.

* cited by examiner

US 7,655,962 B2

ENHANCEMENT MODE INSULATED GATE HETEROSTRUCTURE FIELD-EFFECT TRANSISTOR WITH ELECTRICALLY ISOLATED RF-ENHANCED SOURCE CONTACT

REFERENCE TO PRIOR APPLICATION

The current application claims priority to U.S. Provisional Application No. 60/927,983, entitled "Enhancement Mode Insulated Gate Heterostructure Field-Effect Transistor," filed on May 7, 2007, and hereby incorporated herein by reference.

Aspects of the current application are also related to U.S. Provisional Application No. 60/903,104, entitled "Radio-Frequency Enhanced Contacts to Semiconductor Devices", filed on Feb. 23, 2007, U.S. Provisional Application No. 60/905,634, entitled "Radio-Frequency Enhanced Contacts to Semiconductor Devices", filed on Mar. 8, 2007, U.S. Provisional Application No. 60/903,109, entitled "Method of fabrication of radio-frequency enhanced contacts", filed on Feb. 23, 2007, U.S. Provisional Application No. 60/905,725, entitled "Method of fabrication of semiconductor devices with radio-frequency enhanced contacts", filed on Mar. 8, 2007, co-pending U.S. Utility application Ser. No. 11/781,302, entitled "Composite Contact for Semiconductor Device", filed on Jul. 23, 2007, and co-pending U.S. Utility application Ser. No. 11/781,308, entitled "Fabrication of Semiconductor Device Having Composite Contact", filed on Jul. 23, 2007, all of which are hereby incorporated by reference.

FIELD OF THE DISCLOSURE

Aspects of the invention relate generally to semiconductor device technology, radio frequency devices and circuits, high-power devices, and digital electronic devices, and more particularly, to an enhancement mode insulated gate heterostructure field-effect transistor.

BACKGROUND OF THE DISCLOSURE

Heterostructure field-effect transistors (HFETs), especially those made of wide bandgap semiconductor materials such as AlGaInN, offer tremendous advantages for high-power, high-frequency electronics over many other transistor types (e.g., Si based MOSFETs and bipolar transistors, GaAs and other III-V compound based MESFETs, etc). These advantages are related to very high two-dimensional (2D) electron gas densities at the heterointerface, high operating temperatures, and chemical inertness and radiation hardness of III-N and other wide bandgap materials. Furthermore, the insulated gate HFET modification (MOSHFET) offers additional advantages in terms of extremely low gate leakage currents, higher channel currents, and improved stability and reliability.

The majority of the HFETs and MOSHFETs are so-called depletion-mode (also referred to as "normally-on") devices. This implies that when no or zero voltage is applied at the gate electrode, the transistor is in its "on" state, a conducting channel exists between the source and drain electrodes, and significant current is delivered into the load. Gate voltage needs to be applied to this type of transistor to turn it "off", deplete the channel, and make the drain current close to zero. For n-channel HFETs, the required gate voltage is negative.

Depletion mode devices have several significant drawbacks for practical applications. For example, depletion mode devices consume power when no gate voltage (i.e., input signal) is applied. This decreases the overall system power efficiency, which has a negative impact on integrated digital electronics and power electronic circuits utilizing HFETs. Further, HFET circuits require dual-polarity voltage supplies: positive for drain biasing and negative for gate biasing.

Enhancement-mode (E-mode) devices have their channel in the "off" state when the gate voltage is zero; thus they are free from the above drawbacks. However, such a "normally-off" performance is hardly achievable in a regular GaN-based HFET design due to the presence of 2D electron gas in the HFETs induced by polarization doping. Such polarization doping is caused by the differences between piezoelectric and spontaneous polarizations in the wide band gap barrier layer material (typically AlGaN) and in the channel.

Several approaches to creating enhancement mode HFETs have been described in the related art, requiring either plasma treatment or selective barrier etching under the gate, or very thin barriers to reduce the 2D electron gas density at zero gate bias. These approaches, however, lead to significant technological complications, high access region resistances, and resulting performance limitations.

A GaAs-based E-mode HFET structure using selective barrier etching is shown in FIG. 1. This technology is much more complicated than that of regular HFETs as it requires precise etched thickness control. As applied to III-Nitride materials, etching adversely affects the HFET performance; the devices with thin barriers have higher access resistances and lower peak currents. As an example, as shown in FIG. 2, the peak currents for a related art AlGaN/GaN E-mode device were 0.25 A/mm, whereas depletion mode AlGaN/GaN HFETs have peak current in excess of 1 A/mm.

SUMMARY OF THE INVENTION

Aspects of the present invention are directed to a semiconductor device based on the strain—energy-band engineering technique, double heterostructure design, MOSHFET technology, and quaternary alloy technology, which allows for enhancement mode operation with precise threshold voltage control and for high channel current. The device of the present invention also combines the advantages of enhancement mode HFETs and insulated gate design to provide low gate leakage currents and high reliability.

Aspects of the present invention provide an enhancement mode (E-mode) insulated gate (IG) double heterostructure field-effect transistor (DHFET) having low power consumption at zero gate bias, low gate currents, and/or high reliability. Circuit design can be simplified by eliminating the need for bipolar voltage sources.

A first aspect of the invention provides an enhancement mode heterostructure field-effect transistor (E-mode HFET) comprising: top and bottom barrier layers; and a channel layer sandwiched between the bottom and the top barrier layers, wherein the bottom and top barrier layers have a larger bandgap than the channel layer, and wherein polarization charges of the bottom barrier layer deplete the channel layer and polarization charges of the top barrier layer induce carriers in the channel layer; and wherein a total polarization charge in the bottom barrier layer is larger than a total polarization charge in the top barrier layer such that the channel layer is substantially depleted at zero gate bias.

A second aspect of invention provides an enhancement mode heterostructure field-effect transistor (E-mode HFET) comprising: top and bottom AlInGaN barrier layers; and an AlInGaN channel layer sandwiched between the bottom and the top AlInGaN barrier layers, wherein the bottom and top AlInGaN barrier layers have a larger bandgap than the channel layer, and wherein polarization charges of the bottom AlInGaN barrier layer deplete the AlInGaN channel layer and polarization charges of the top AlInGaN barrier layer induce carriers in the AlInGaN channel layer; and wherein a total polarization charge in the bottom AlInGaN barrier layer is larger than a total polarization charge in the top AlInGaN barrier layer such that the AlInGaN channel layer is substantially depleted at zero gate bias.

A third aspect of invention provides a method for forming an enhancement mode heterostructure field-effect transistor (E-mode HFET) comprising: providing top and bottom barrier layers; and sandwiching a channel layer between the bottom and the top barrier layers, wherein the bottom and top barrier layers have a larger bandgap than the channel layer, and wherein polarization charges of the bottom barrier layer deplete the channel layer and polarization charges of the top barrier layer induce carriers in the channel layer; and wherein a total polarization charge in the bottom barrier layer is larger than a total polarization charge in the top barrier layer such that the channel layer is substantially depleted at zero gate bias.

BRIEF DESCRIPTION OF THE DRAWINGS

These and other features of this invention will be more readily understood from the following detailed description of the various aspects of the invention taken in conjunction with the accompanying drawings in which.

It is noted that the drawings of the invention are not to scale. The drawings are intended to depict only typical aspects of the invention, and therefore should not be considered as limiting the scope of the invention.

DETAILED DESCRIPTION

It is understood that for the purposes of the disclosure, Al means Aluminum, As means Arsenic, Ga means Gallium, Hf means Hafnium, In means Indium, O means Oxygen, N means Nitrogen, and Si means Silicon. Further, it is understood that the phrase "any solution" means any now known or later developed solution.

As detailed above, aspects of the present invention provide an enhancement mode (E-mode) insulated gate (IG) double heterostructure field-effect transistor (DHFET) having low power consumption at zero gate bias, low gate currents, and/or high reliability. Circuit design can be simplified by eliminating the need for bipolar voltage sources.

Figure 1:
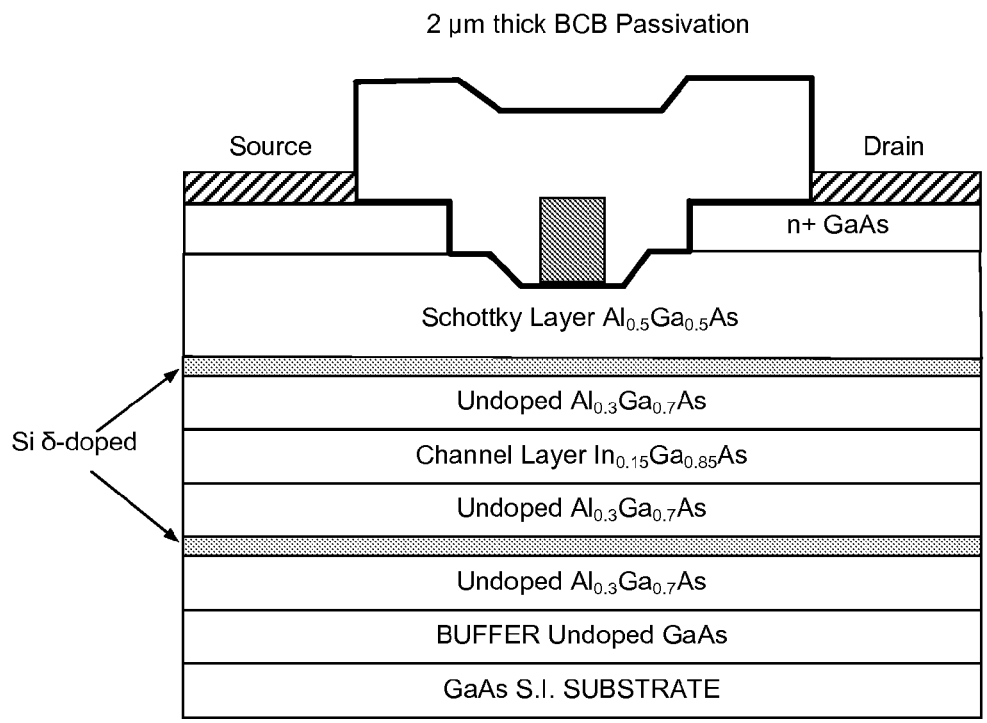
FIG. 1 depicts an illustrative GaAs-based E-mode HFET structure in accordance with the related art.
Figure 2:
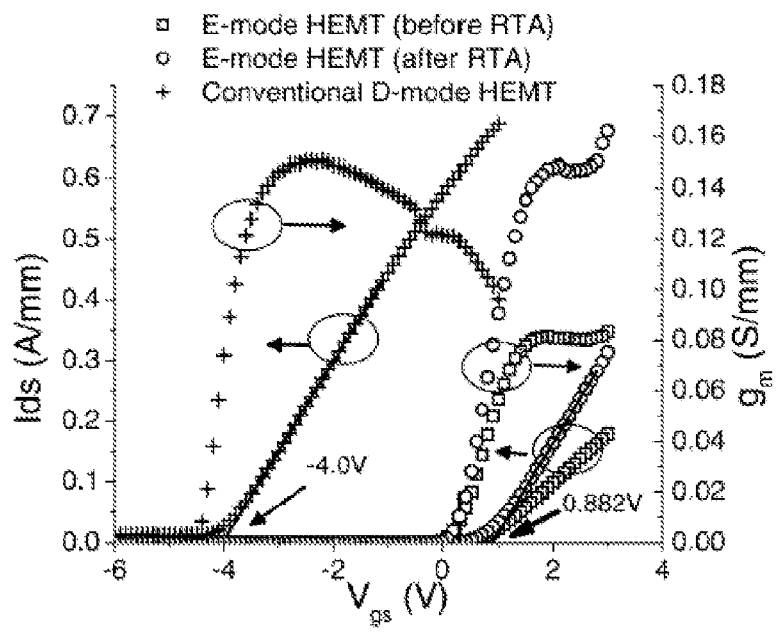
FIG. 2 depicts the transfer characteristics of an illustrative AlGaN/GaN E-mode HFET in accordance with the related art.
Figure 3:
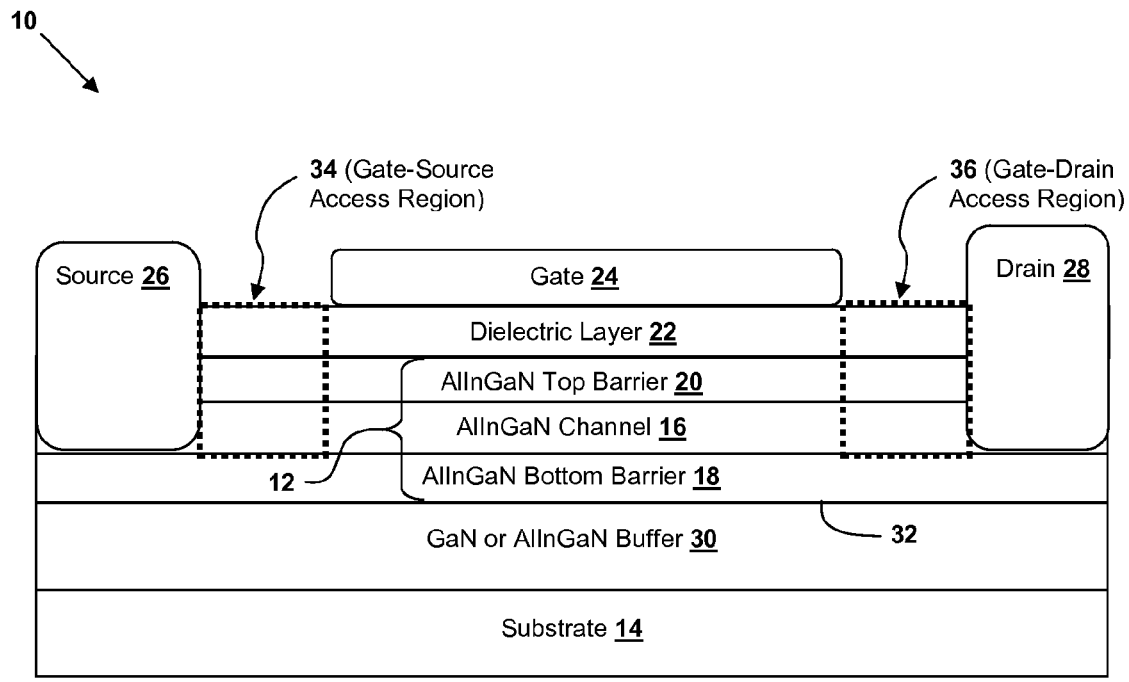
FIG. 3 depicts a layout of an illustrative E-mode IG-DHFET according to an embodiment.

The epitaxial structure of an illustrative E-mode IG-DHFET 10 in accordance with an embodiment is depicted in FIG. 3. The IG-DHFET 10 comprises an AlInGaN/AlInGaN/AlInGaN heterostructure 12 grown over an insulating substrate 14. The insulating substrate 14 can be formed of any suitable material including, for example, sapphire, silicon, silicon carbide, etc. The AlInGaN/AlInGaN/AlInGaN heterostructure 12 comprises an AlInGaN channel layer 16 sandwiched between a bottom AlInGaN barrier layer 18 and a top AlInGaN barrier layer 20, with the bottom AlInGaN barrier layer 18 and the top AlInGaN barrier layer 20 having a higher Al content and larger bandgaps than the AlInGaN channel layer 16.

Typically, the Al fraction in the AlInGaN barrier layers 18 and 20 can be between about 10% and 35%, and the In fraction can be between about 0% and 10%. The Al and In fractions in the top AlInGaN barrier layer 20 are typically the same or lower than those of the bottom AlInGaN barrier layer 18. Typical thicknesses range from about 5 nm to about 100 nm for the bottom AlInGaN barrier layer 18, from about 3 nm to about 30 nm for the top AlInGaN barrier layer 20, and from about 3 nm to about 30 nm for the AlInGaN channel layer 16. The bottom AlInGaN barrier layer 18, AlInGaN channel layer 16, and top AlInGaN barrier layer 20 can be formed using any solution.

The Al and In compositions in the AlInGaN channel layer 16 and the bottom and top AlInGaN barrier layers 18, 20 vary as described above so that the AlInGaN channel layer 16 is depleted due to the combined action of polarization charges and bandgap offsets at its interfaces with the bottom and top AlInGaN barrier layers 18, 20. The polarization charges of the bottom AlInGaN barrier layer 18 deplete the AlInGaN channel layer 16, while the polarization charges of the top AlInGaN barrier layer 20 induce carriers in the AlInGaN channel layer 16. When the Al and In fractions in the bottom AlInGaN barrier layer 18 are larger than that in the top AlInGaN barrier layer 20, the total polarization charge of the bottom barrier layer is also larger. Being negative, this charge helps to deplete the 2D channel. As a result, the combined effect of the top and bottom AlInGaN barrier layers 18, 20 substantially depletes the AlInGaN channel layer 16.

The combined action of polarization charges and bandgap offset causes the AlInGaN channel layer 16 to be depleted of 2D electron gas at zero gate bias. The quantum well-like structure of the AlInGaN/AlInGaN/AlInGaN heterostructure 12, however, provides enough room for a high-density 2D electron gas to be formed if the applied gate bias is positive.

A thin dielectric layer 22 can be formed under the gate electrode 24 and over the top AlInGaN barrier layer 20. The dielectric layer 22 allows a high positive gate bias to be applied at the gate electrode 24 to induce more carriers and higher current in the AlInGaN channel layer 16, without causing significant gate leakage current and corresponding performance degradation of the E-mode IG-DHFET 10. The low gate leakage current also ensures high device stability and reliability in the E-mode IG-DHFET 10.

The dielectric layer 22 can cover the entire region between the source electrode 26 and drain electrode 28, or any part of it including the region under the gate electrode 24. The dielectric layer 22 can comprise, for instance, $SiO_2$, $Si_3N_4$, $Si_xO_yN_z$ (with $1<x<3$, $0<y<2$ and $0<z<4$), $HfO_2$, or any other suitable thin-film dielectric.

The E-mode IG-DHFET 10 can include a buffer layer 30, disposed under the bottom AlInGaN barrier layer 18, to improve the material quality in the barrier—channel regions. The buffer layer 30 can be formed of a material such as GaN, AlInGaN, and/or the like. The doping and composition of the buffer layer 30 are designed to suppress the formation of a parasitic conducting layer (channel) at the interface 32 between the bottom AlInGaN barrier layer 18 and the buffer layer 30. This can be done, for example, by doping the buffer layer 30 with shallow acceptors (p-doping) or with deep acceptors (deep compensation) to prevent the formation of a parasitic electron conducting channel. The thickness of the buffer layer 30 typically ranges from about 3 nm to about 3000 nm.

One important parameter in E-mode field-effect transistors is the source/drain access resistances. A problem arises from the fact that in an E-mode device, the channel is depleted in the equilibrium conditions. The application of positive (in the case of an n-channel device) gate voltage induces the carriers under the gate but not in the gate-source and gate-drain access regions. Illustrative gate-source 34 and gate-drain 36 access regions in the E-mode IG-DHFET 10 are shown in FIG. 3. Therefore, other means are needed to achieve highly conductive (low resistance) gate-source and gate-drain access regions. In low-frequency devices, the gate-source and gate-drain access regions can be completely eliminated by overlapping the gate electrode with the source and drain contacts and using an intervening dielectric film to prevent gate-source and gate-drain shorting. This design however, is practically useless for high-frequency devices as it leads to high source-gate and source-drain capacitances.

Figure 4:
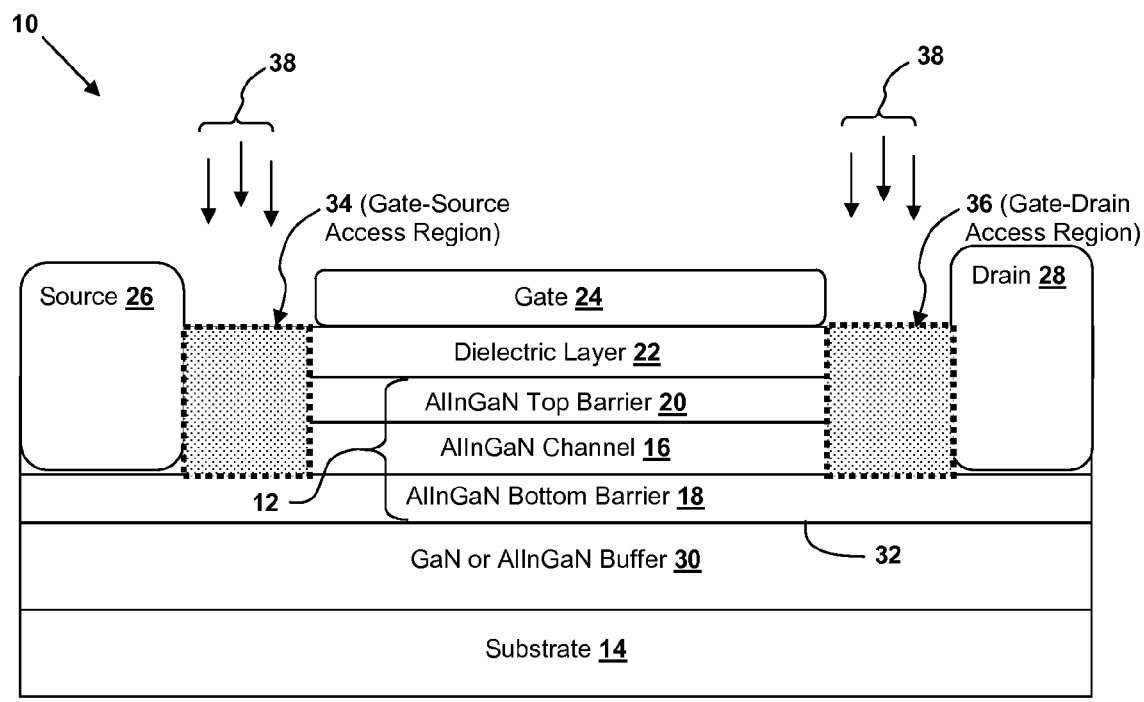
FIG. 4 depicts a layout of an illustrative E-mode IG-DHFET, having gate-source and gate-drain access regions formed by ion implantation, according to an embodiment.

Aspects of the present invention provide a plurality of techniques to achieve low access resistance in the gate-source 34 and gate-drain 36 access regions of the E-mode IG-DHFET 10. A first technique is depicted in FIG. 4, in which low resistance gate-source 34 and gate-drain 36 access regions are obtained using ion implantation 38.

Group III-Nitride based devices normally operate at high drain bias. Too high of a doping level in the implanted gate-source 34 and gate-drain 36 access regions may cause the entire drain-gate voltage to be applied across the dielectric layer 22 leading to premature breakdown. To avoid this, the implantation dose must be adjusted for an optimal concentration of implanted donors. The concentration of implanted donors is determined based on desired depletion region width in the gate-drain spacing at the highest operating drain voltage. Typically, the implanted donor concentration will be in the range of $10^{18}$-$10^{19}$ cm$^{-3}$ depending on the device operating voltage and frequency. The relevant implantation dose, $N_s$, can be estimated as follows $$N_s = \frac{\alpha \varepsilon E_b}{q}$$

Here $\alpha$ is a constant on the order of unity determined by the device layer structure, $\in$ is the dielectric permittivity of the semiconductor, $E_b$ is the breakdown field, and q is the electronic charge. Typically, $N_s$ is in the range between $10^{12}$ to $10^{13}$ cm$^{-2}$.

Another way to achieve low access resistances in the gate-source and gate-drain access regions is by using RF-enhanced contacts. The RF enhanced contacts can be formed, for example, using metal electrodes, deposited on top of the AlInGaN/AlInGaN/AlInGaN heterostructure, having a strong capacitive coupling with the AlInGaN channel layer 16. A technique for providing such RF enhanced contacts is described, for example, in co-pending U.S. Utility Application Ser. No. 11/781,308, entitled "Fabrication of Semiconductor Device Having Composite Contact", filed on Jul. 23, 2007, which was previously incorporated by reference.

Figure 5:
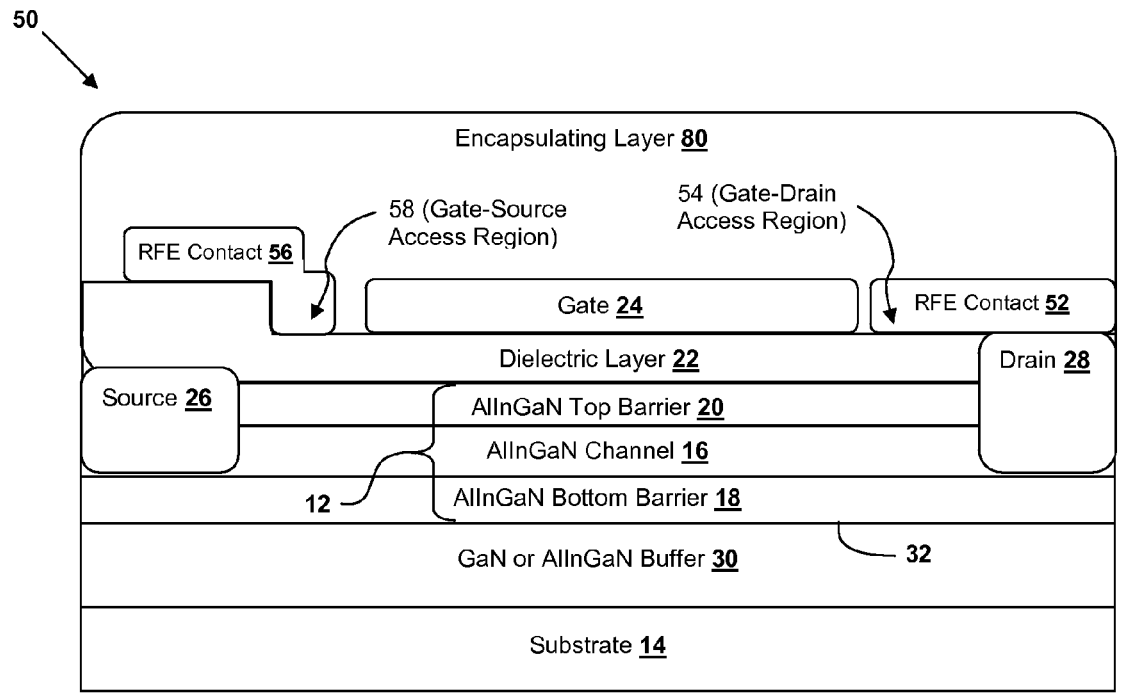
FIG. 5 depicts a layout of an illustrative E-mode IG-DHFET, having gate-source and gate-drain access regions formed by RF-enhanced contacts, according to an embodiment.

An illustrative E-mode IG-DHFET 50 employing such RF-enhanced (RFE) contacts is depicted in FIG. 5. As shown, the E-mode IG-DHFET 50 has a structure similar to that of the E-mode IG-DHFET 10 (FIGS. 3-4). In this case, however, the dielectric layer 22 extends over the source electrode 26. On the drain electrode 28 side, an RFE drain contact 52 is connected to the drain electrode 28, thus providing positive potential at the device surface in the gate-drain spacing. This positive potential induces electrons in the AlInGaN channel layer 16, reducing the access resistance in the gate-drain access region 54. On the source electrode 26 side, an RFE contact 56 is isolated from the source electrode 26 by the dielectric layer 22. Additional positive bias is applied to the RFE contact 56 to induce the carriers in the AlInGaN channel layer 16, reducing the access resistance in the gate-source access region 58. The spacing between the gate electrode 24 and the RFE contacts 52, 56 is chosen such that no breakdown occurs at the desired operating voltage and, at the same time, the space-charge induced current through the spacing is equal to or higher than the peak channel current at a drain voltage equal to the knee voltage. To this extent, the resistance of the spacing does not limit the device peak current.

Figure 6:
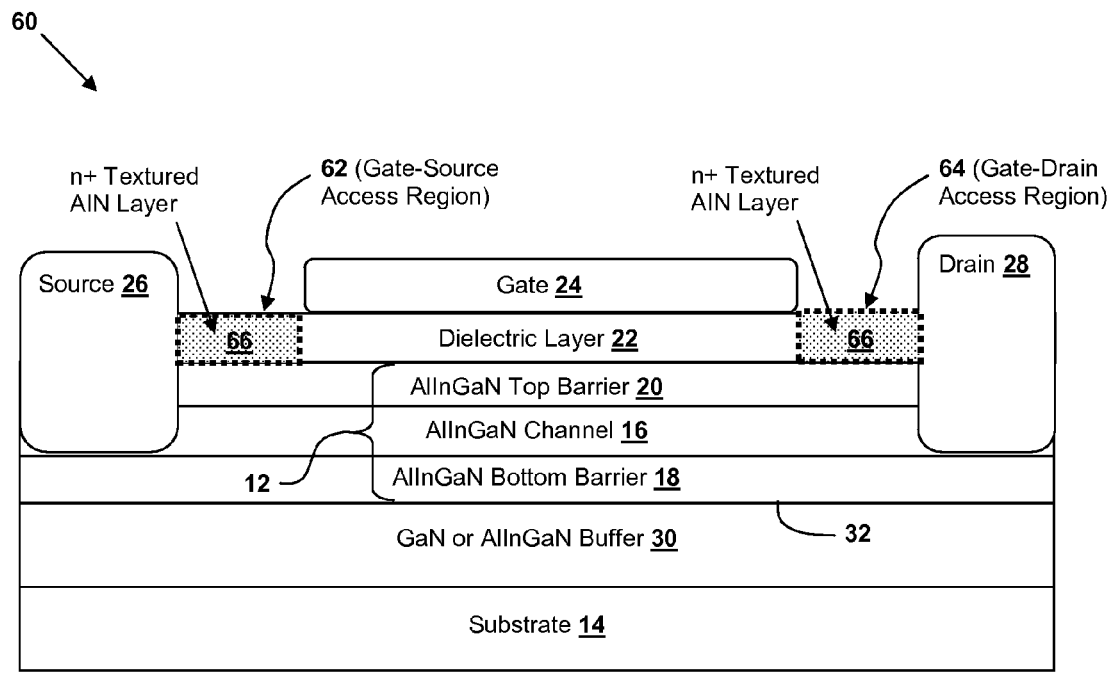
FIG. 6 depicts a layout of an illustrative E-mode IG-DHFET, having gate-source and gate-drain access regions formed by deposition and subsequent patterning of a highly conductive textured AlN layer, according to an embodiment.

Yet another approach to achieve low access resistance is depicted in FIG. 6. As shown, the E-mode IG-DHFET 60 has a structure similar to that of the E-mode IG-DHFET 10 (FIGS. 3-4). In this case, however, the gate-source and gate-drain access regions 62, 64 are formed using an n+ textured AlN layer 66. The n+ textured AlN layer 66 can be deposited on the top AlInGaN barrier layer 20 in the spacing between the source and drain electrodes 26, 28, and patterned prior to the subsequent deposition of the dielectric layer 22 and gate electrode 24. A suitable technique for forming the n+ textured AlN layer 66 is disclosed in commonly assigned U.S. Pat. No. 6,903,385, which is incorporated herein by reference. Use of the n+ textured AlN layer 66 leads to the formation of a deep quantum well in the AlInGaN channel layer 16, high density 2D gas under the n+ textured AlN layer 66, and low access resistance in the gate-source and gate-drain access regions 62, 64.

It is understood that any of the above-described E-mode IG-DHFETs can undergo additional processing, such as the formation of one or more additional layers. For example, operation of a high-power semiconductor device may be limited by premature breakdown, which can be caused by a high voltage jumping through the air or another medium adjacent to the contact regions and the spacing between the contacts (e.g., surface flashover). In this case, the device can include additional layer(s) to prevent or reduce the likelihood of premature breakdown. To this extent, FIG. 5 shows an encapsulating layer 80 on the E-mode IG-DHFET 50. The encapsulating layer 80 can comprise a high dielectric strength insulating material that increases a breakdown voltage of the E-mode IG-DHFET 50, thereby helping to prevent a premature breakdown of the E-mode IG-DHFET 50. The material can have a high breakdown field that well exceeds that of air and is close to that of the material constituting the E-mode IG-DHFET 50. Illustrative examples of materials for encapsulating layer 80 include silicon dioxide, silicon nitride, bis-benzocyclobutene, and/or the like. While encapsulating layer 80 is shown in conjunction with the E-mode IG-DHFET 50, it is understood that encapsulating layer 80 can be included on any type of semiconductor device.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed:

1. A circuit comprising:
   an enhancement mode heterostructure field-effect transistor (E-mode HFET) including:
   top and bottom barrier layers;
   a channel layer sandwiched between the bottom and the top barrier layers, wherein the bottom and top barrier layers have a larger bandgap than the channel layer;
   a gate electrode;
   source and drain electrodes coupled with the channel layer;
   a first electrode, distinct from the gate electrode and the source and drain electrodes, capacitively coupled with the channel layer, and isolated from the source electrode, the gate electrode, and the drain electrode; and
   a second electrode, distinct from the first electrode, the gate electrode and the source and drain electrodes, capacitively coupled with the channel layer and coupled to the drain electrode and isolated from the first electrode;
   a first positive bias coupled to the first electrode; and
   a second positive bias coupled to the second electrode and the drain, wherein the first electrode and the first positive bias lower an access resistance of a gate-source access region, and wherein the second electrode and the second positive bias lower an access resistance of a gate-drain access region.

2. The circuit of claim 1, wherein the channel layer and the bottom and top barrier layers comprise AlInGaN compounds.

3. The circuit of claim 1,
   wherein polarization charges of the bottom barrier layer deplete the channel layer and polarization charges of the top barrier layer induce carriers in the channel layer when a bias is applied to at least one of the source electrode or drain electrode;
   wherein a total polarization charge in the bottom barrier layer is larger than a total polarization charge in the top barrier layer such that the channel layer is substantially depleted at zero gate bias.

4. The circuit of claim 1, wherein the first and second electrodes comprise metal contacts.

5. The circuit of claim 1, the HFET further including:
   a dielectric layer separating the gate electrode from the top AlInGaN barrier layer.

6. The circuit of claim 5,
   wherein the dielectric layer covers at least a portion of a region between the source electrode and the drain electrode.

7. The circuit of claim 5, wherein the dielectric layer comprises a material selected from the group consisting of $SiO_2$, $Si_3N_4$, $Si_xO_yN_z$ (with $1<x<3$, $0<y<2$ and $0<z<4$), and $HfO_2$.

8. The circuit of claim 1, the HFET further including:
   a buffer layer disposed below the bottom AlInGaN barrier layer.

9. The circuit of claim 8, wherein the buffer layer is p-doped to prevent formation of a parasitic conducting channel.

10. The circuit of claim 8, wherein the buffer layer is deeply compensated to prevent formation of a parasitic conducting channel.

11. The circuit of claim 8, wherein the buffer layer comprises a material selected from the group consisting of GaN and AlInGaN.

12. An enhancement mode heterostructure field-effect transistor (E-mode HFET) comprising:
    top and bottom barrier layers;
    a channel layer sandwiched between the bottom and the top barrier layers, wherein the bottom and top barrier layers have a larger bandgap than the channel layer;
    a gate electrode;
    source and drain electrodes coupled with the channel layer;
    a first electrode, distinct from the gate electrode and the source and drain electrodes, capacitively coupled with the channel layer, and isolated from the source electrode, the gate electrode, and the drain electrode; and
    a second electrode, distinct from the first electrode, the gate electrode and the source and drain electrodes, capacitively coupled with the channel layer and coupled to the drain electrode and isolated from the first electrode;
    wherein the first electrode extends beyond the source electrode into a gate-source access region, and wherein the second electrode extends beyond the drain electrode into a gate-drain access region.

13. The E-mode HFET of claim 12,
    wherein polarization charges of the bottom barrier layer deplete the channel layer and polarization charges of the top barrier layer induce carriers in the channel layer when a bias is applied to at least one of the source electrode or drain electrode; and
    wherein a total polarization charge in the bottom barrier layer is larger than a total polarization charge in the top barrier layer such that the channel layer is substantially depleted at zero gate bias.

14. The E-mode HFFT of claim 12, wherein the first and second electrodes comprise metal contacts.

15. The E-mode HFFT of claim 12, further comprising:
    a buffer layer disposed below the bottom barrier layer.

16. The E-mode HFFT of claim 15, wherein the buffer layer is p-doped to prevent formation of a parasitic conducting channel.

17. The E-mode HFET of claim 15, wherein the buffer layer is deeply compensated to prevent formation of a parasitic conducting channel.

18. The E-mode HFET of claim 15, wherein the buffer layer comprises a material selected from the group consisting of GaN and AlInGaN.

19. The E-mode HFET of claim 12, further comprising:
    a dielectric layer separating the gate electrode from the top barrier layer.

20. The E-mode HFFT of claim 19,
    wherein the dielectric layer covers at least a portion of a region between the source electrode and the drain electrode.

21. The E-mode HFFT of claim 19, wherein the dielectric layer comprises a material selected from the group consisting of $SiO_2$, $Si_3N_4$, $Si_xO_yN_z$ (with $1<x<3$, $0<y<2$ and $0<z<4$), and $HfO_2$.

22. The E-mode HFET of claim 12, wherein the channel layer and the bottom and top barrier layers comprise AlInGaN compounds.

23. The E-mode HFET of claim 22, wherein the bottom and top barrier layers have a higher Al content than the channel layer.

24. A method for forming an enhancement mode heterostructure field-effect transistor (E-mode HFET) comprising:
    obtaining a structure including:
    top and bottom barrier layers;
    a channel layer sandwiched between the bottom and the top barrier layers, wherein the bottom and top barrier layers have a larger bandgap than the channel layer; and
    gate, source, and drain electrodes, wherein the source and drain electrodes are coupled with the channel layer;

capacitively coupling a first electrode, distinct from the gate electrode and the source and drain electrodes, with the channel layer, and isolating the first electrode from the source electrode, the gate electrode, and the drain electrode; and capacitively coupling a second electrode, distinct from the first electrode, the gate electrode and the source and drain electrodes, with the channel layer and coupling the second electrode to the drain electrode and isolated from the first electrode;

wherein the first electrode extends beyond the source electrode into a gate-source access region, and wherein the second electrode extends beyond the drain electrode into a gate-drain access region.

25. The method of claim 24, wherein polarization charges of the bottom barrier layer deplete the channel layer and polarization charges of the top barrier layer induce carriers in the channel layer when a bias is applied to at least one of the source electrode or drain electrode, and wherein a total polarization charge in the bottom barrier layer is larger than a total polarization charge in the top barrier layer such that the channel layer is substantially depleted at zero gate bias.

26. The method of claim 24, wherein the channel layer and the bottom and top barrier layers comprise AlInGaN compounds.

27. The circuit of claim 2, wherein the bottom and top barrier layers have a higher Al content than the channel layer.

* * * * *